United States Patent [19]

Ito

[11] 4,313,214

[45] Jan. 26, 1982

[54] ELECTRONIC TUNING RADIO RECEIVER

[75] Inventor: Tatsuo Ito, Kobe, Japan

[73] Assignee: Fujitsu-Ten, Ltd., Kobe, Japan

[21] Appl. No.: 217,322

[22] PCT Filed: Jan. 29, 1979

[86] PCT No.: PCT/JP79/00019

§ 371 Date: Sep. 24, 1979

§ 102(e) Date: Sep. 24, 1979

[87] PCT Pub. No.: WO79/00570

PCT Pub. Date: Aug. 23, 1979

[30] Foreign Application Priority Data

Jan. 31, 1978 [JP] Japan .................................. 53-10133
Jan. 31, 1978 [JP] Japan .............................. 53-11429[U]

[51] Int. Cl.³ ............................................. H04B 1/26
[52] U.S. Cl. .................................. 455/160; 455/180; 455/184; 455/185
[58] Field of Search ......... 455/160, 180, 182, 184–186

[56] References Cited

U.S. PATENT DOCUMENTS

| | | | |
|---|---|---|---|
| 3,931,579 | 1/1976 | Ma et al. ............................. | 455/184 |
| 3,943,449 | 3/1976 | Hendrickson et al. . | |
| 4,053,838 | 10/1977 | Amaya . | |
| 4,207,529 | 6/1980 | Amaya et al. ........................ | 455/169 |
| 4,207,531 | 6/1980 | Ito ...................................... | 455/184 |

Primary Examiner—Marc E. Bookbinder
Attorney, Agent, or Firm—Oblon, Fisher, Spivak, McClelland & Maier

[57] ABSTRACT

An electronic tuning radio receiver for executing digital channel selection is provided with a circuit means (b9) for detecting that a receiving frequency is out of the band and circuits (60, 62, 48, 50) for returning the receiving frequency within the band by the output of the above circuit means. Disadvantages that the receiving frequency is further driven below the lower limit of the band in the band switching can be avoided by these circuits. Pulse generator circuits (144, 142) are connected for the strobe terminals (G) of the multiplexer (46) switching various types of channel selection systems to moderate the channel selection speed by these circuits.

7 Claims, 12 Drawing Figures

ELECTRONIC TUNING RADIO RECEIVER

BACKGROUND OF THE INVENTION

1. Field of the Invention

This invention concerns a multi-band electronic tuning radio receiver capable of selecting channels in various systems such as digital channel selection, search channel selection and manual channel selection.

2. Background of Art

Electronic tuning, that is, electronic channel selection can be executed using electrically controllable variable reactance elements such as voltage-variable capacitance diodes in tuning circuits of a radio receiver and by providing a circuit for generating a bias voltage for controlling the above elements and, for the channel selection method, various systems are usable such as a search system adapted to sweep a broadcasting frequency band by the generation of a gradually increasing or decreasing control voltage, a digital system adapted to set a frequency for a broadcasting station in a digital manner and change a control voltage as far as the above frequency is reached or a manual system adapted to execute the channel selection by changing a control voltage manually. The applicant has already proposed for these systems such as in Japanese Patent Application Nos. 39648/1976, 40024/1976, 129831/1976 and 70270/1977.

The radio receiver of this type has a basic structure, as shown in FIG. 1, in which in a usual superheterodyne type radio receiver consisting of an antenna 10, a high frequency amplifying stage 12, a local oscillation stage 14, an intermediate frequency amplifying stage 16, a detection stage 18, a low frequency amplifying stage 20 and a speaker 22, voltage-variable reactance elements 11 and 13 are used in the tuning circuits for the high frequency amplifying stage and the local oscillation stage, and moreover a voltage memory 24 for supplying a control voltage (bias voltage) to the elements, a control circuit 26 for the memory, a counter 28, a comparator 30, channel selection switches 32, a frequency code memory 34 and a frequency display section 36 are provided to the receiver. The voltage-variable reactance elements are, for example, made of voltage-variable capacitance diodes. The voltage memory basically consists of an integrating circuit provided with over a long time period.

The outline of the operation is as follows. Upon push of a manual channel selection switch in the selection switches 32, the control circuit 26 outputs an upward (positive) or a downward (negative) signal Iu or Id, by which the voltage memory 24 generates a gradually increasing or decreasing bias voltage to change the capacitance in the variable reactance elements 11 and 13. When a broadcasting wave is received and the broadcasting issues from the speaker 22, an audience hears it and, if it is a desired one, stops the push for the switch to enter to a receiving state. The audience keeps to push the switch, if it is not a desired one, and searches the next broadcasting station. Upon search channel selection, the search channel selection switch in the selection switches is pushed temporarily. This causes the flip-flops in the control circuit 26 to be set to output the signal Iu or Id. When a broadcasting wave is received, the flip-flops are reset by the intermediate frequency output from the intermediate frequency amplifying stage 16 and the signal Iu or Id is eliminated. If the broadcasting wave is a desired one the receiver enters into the receiving state as it is and, if not, the switch may be pushed again. Also upon digital channel selection, a predetermined digital channel selection switch in the selection switches 32 is pushed. This reads out the code for a predetermined broadcasting station from the memory 34 and it is compared in the comparator 30 with a value counted on the counter 28 for counting the local oscillation frequency of the local oscillator 14. The control circuit 26 outputs the upward or the downward signal Iu or Id till both of them coincide and, when the coincidence is attained, the signals are eliminated to proceed to the receiving state.

While the above radio receiver is constructed as a multi-band type receiver capable of listening to FM broadcasting as well as AM broadcasting, the following problems are resulted upon band switching. Channel selection is executed by the increase or decrease in the control voltage outputted from the voltage memory 24 to thereby vary the capacitance of the element 11 and 13, and a curve A for an A band and a curve B for a B band will be plotted, as shown in FIG. 2, in which the voltage value V is indicated on the ordinate and the receiving frequency F varied with the voltage is indicated on the abscissa. In the figure, A and B represent, for example, AM and FM bands respectively and W is a band width for each of the bands. While the frequencies for each of the band are different, they are shown at the same positions on the abscissa based on different units. As can be seen from the figure, the varying range for the control voltage required for covering the entire area of the frequency band is a width Va between Va$_1$ and Va$_2$ for the A band, and that for the B band is a width Vb between Vb1 and Vb2. Although the coincidence between the curves A and B is possible experimentally, it is difficult to attain such coincidence in case of actual mass production due to scatterings in individual elements and influences by changes in temperature or the like. Then, when the A band is switched to the B band during reception at the point C in the A band, since the control voltage is not changed, the receiving frequency transists to point D thus to exceed the frequency range for the band B. As a preset counter or the like is used for the channel selection, which is adapted to take a minimum value: 00 ... 0 at the lower limit and the maximum value at the upper limit in each of the bands, the counted value in the counter is switched to the side of the maximum value when shifted out of the range, whereby the frequency further lowers, that is, further apart from the band in the case of the digital channel selection. It is, therefore, necessary to provide a wider idle range for the lower limit (also for the upper limit), or to take such a procedure as manually upwarding the receiving position in the band A so that the switched position may situate above the lower limit E and, thereafter, switching to the digital channel selection.

In the prior art the electronic tuning radio receiver has various types of channel selection systems. While these systems may be provided individually independent from each other, since the variable reactance elements and the control voltage generation section therefor can be used in common, it is customary to employ them in common and provide a multiplexer for utilizing selectively one of them by switching.

In the digital channel selection system, for example, although a high varying speed is desired for the control voltage since it determines a time required for the channel selection, an excessively high speed may cause hunting. Then it is desired to decrease the varying speed in the control voltage as the receiving frequency approaches a set (desired) frequency. In the search channel selection while a high varying speed of the control voltage is also desired since it determines a time required for sweeping the broadcasting frequency band, an excessively high speed provides a problem in the channel selection for a broadcasting station directly adjacent to the present dial position that the adjacent station is passed over in a moment from push to release of the search channel selection button and can not be received. Thus, it is desired to decrease the varying speed in the control voltage just after the depression of the pushbutton. Similar problem is also resulted in the case of the manual channel selection.

Duty ratio in the upward or the downward signal pulse Iu or Id issued from the voltage memory consisting of the integrating circuit is changed in order to change the varying speed in the control voltage, that is, the sweeping speed, and the circuit already proposed comprises a duty changing gate circuit in each of the channel selection systems, which makes the circuit somewhat complicated.

When the channel selection in each of the systems has been completed, the receiver becomes receiving state, wherein AFC (automatic frequency control) is applied to enable the reception always at the best condition. While the AFC is applied by preparing the foregoing positive or negative input voltage based on the output from a discriminator of an S characteristic, hunting may possibly be caused if the duty is not controlled properly.

SUMMARY OF THE INVENTION

It is, accordingly, a primary object of this invention to provide an electronic tuning type radio receiver capable of executing the band switching in the digital channel selection systems smoothly and securely with no requirement for additional operations.

Another object of this invention is to control the varying speed in the control voltage for variable reactance elements with a very simple means, to thereby smoothly perform each of the channel selection systems and AFC operation.

According to this invention, means for detecting that a receiving frequency is shifted out of the band upon band switching is provided and the control voltage is forcibly changed to the value within the above band by the output of the detection means. This can eliminate the defect that the receivable frequency below the lower limit of the band is further driven downwardly.

Further, in this invention, switching pulses are be adapted to be applied by way of a gate circuit to the strobe terminals of a multiplexer. This can eliminate the need for providing a gate circuit to each of the channel selection sections and the AFC system to thereby simplify the circuit.

Other objects and characteristic features of this invention are to be made clearer by the following explanation referring to the accompanying drawings.

DETAILED DESCRIPTION OF THE PREFERRED EMBODIMENTS

Figure 3:
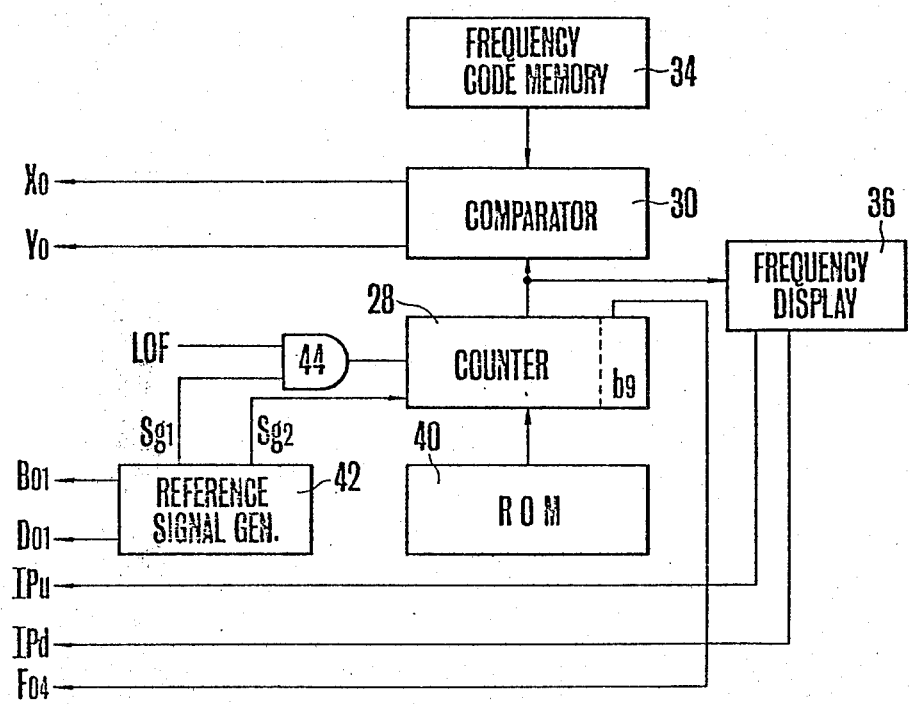
FIG. 3 and FIG. 4 are block diagrams showing preferred embodiments of this invention.
Figure 4:
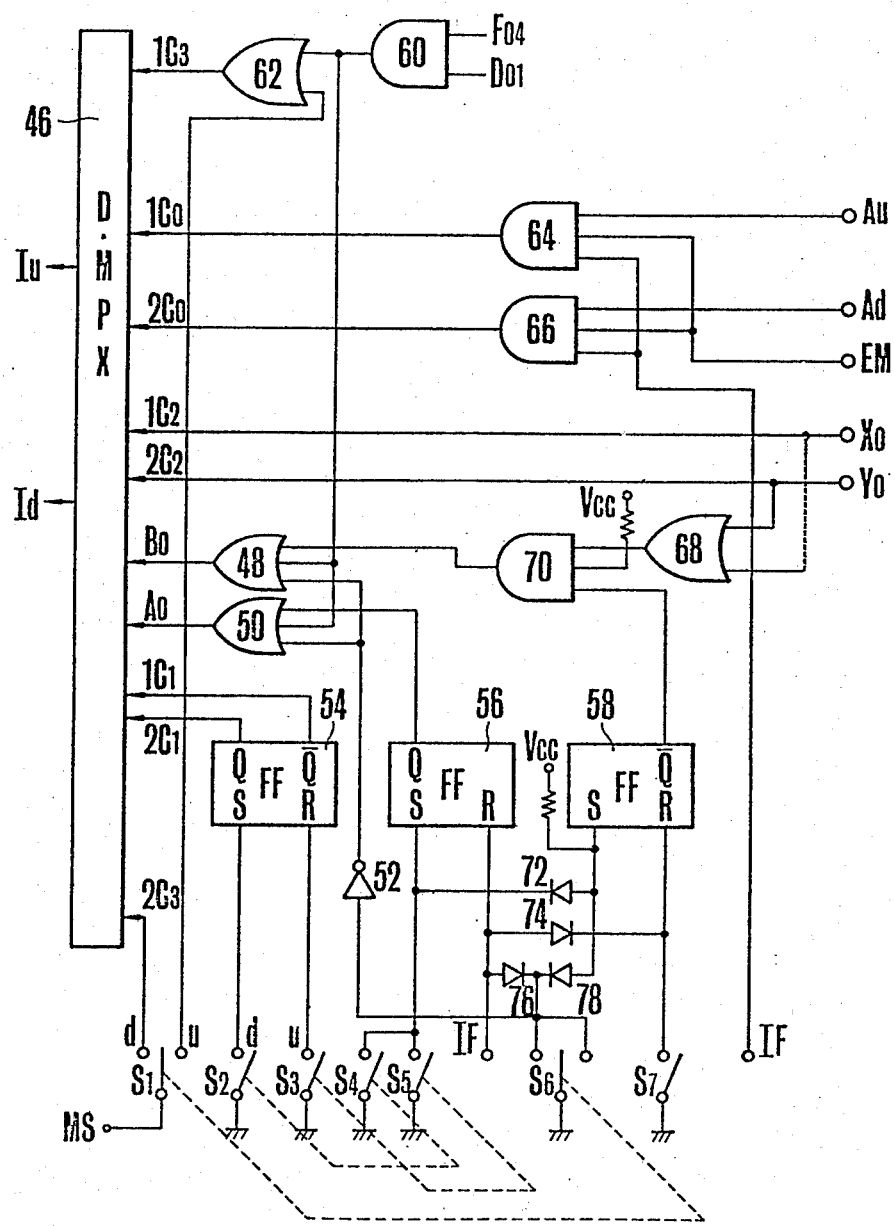

Referring to FIG. 3, this figure shows, in conjunction with FIG. 4, an embodiment of this invention capable of executing smooth band switching in which 34, 30, 28 and 36 show the frequency code memory, the comparator, the counter and the frequency display described above respectively. A reference numeral 42 denotes a reference signal generator, 44 is a sampling gate for local oscillation frequency LOF and 40 is a read only memory. While the counter 28 has been designed as a 8 bit presettable counter in the circuit proposed previously, by which the entire area of the band can be covered, a further 1 bit $b_9$ is added to its upper digit and the counter is preset so that the uppermost 1 bit $b_9$ is at "L" level when the local oscillation frequency is within the band by the output of the memory 40.

More specifically, "1" from the memory 40 may be preset to the bit $b_9$ by a load signal Sg2 from the reference signal generator 42. In this way, if the value of the local oscillation frequency LOF sampled by a signal Sg1 is below the lower limit of the band, the bit $b_9$ remains at "1", that is, "H" level since no carry enters to the bit and, only if the value exceeds the lower limit, a carry enters to the bit turning it to "0", that is, "L" level. Accordingly, the judgement whether the value is below the lower limit or not can be made with ease by monitoring the "H" or "L" level for the bit $b_9$. Signal $F_{04}$ is a signal for indicating the "H" or "L" level for the bit $b_9$.

The reason why the counter 28 can cover the entire area of the band with 8 bits is described here. While the receivable frequency or the tuning frequency of the receiver is detected by counting the oscillation frequency of the local oscillator, frequency ranges are 520~1600 KHz for the AM broadcasting wave band, 76~90 MHz for the FM broadcasting wave band, (520~1600)+455 KHz for the local oscillation frequency and (76~90)−10,7 MHz for the FM local oscillation frequency. The local oscillation frequency is sampled for 1 mS directly for the AM and after divided into 1/10 for FM to obtain (520~1600)+455 shots of pulses for AM and (7600~9000)−1070 shots of pulses for FM on every sampling. They are divided into 1/10 and then further divided into ⅛ for AM and ¼ for FM. Then, 33~69 shots of pulses or 163~199 shots of pulses are obtained for AM and FM respectively, and both of the widths are 36 shots. Each of the pulses is issued on every 30 KHz for AM and on every 400 KHz for FM. Since a counter capable of counting up to 199 for the maximum may be provided but wasteful, a 6 bit counter capable of counting the foregoing 36 shots is used while presetting an appropriate value so that it takes a state: 000001 upon arrival of 33 shots of pulses for AM and a state: 000001 upon arrival of 163 shots of pulses for FM. In this way, the entire area of the band can be covered with 6 bits. However, since the broadcasting frequencies are located at 10 KHz interval for AM and at 100 KHz interval for FM while each of the pulse or bit interval is 30 KHz or 400 KHz, a plurality of broadcasting frequencies can possibly be included within the above pulse or bit interval. In order to distinguish them, it is preferred to constitute a 8 bit counter by adding further 2 lower bits. In FIG. 3, $B_{01}$ and $D_{01}$ represent B, D outputs from a decimal counter contained in the reference signal generator (B, D correspond to $2^1$, $2^3$ bits) and IPu and IPd are signals indicative of the upper and the lower limits of the band and they form an automatic inversion signal at the search channel selection.

Figure 1:
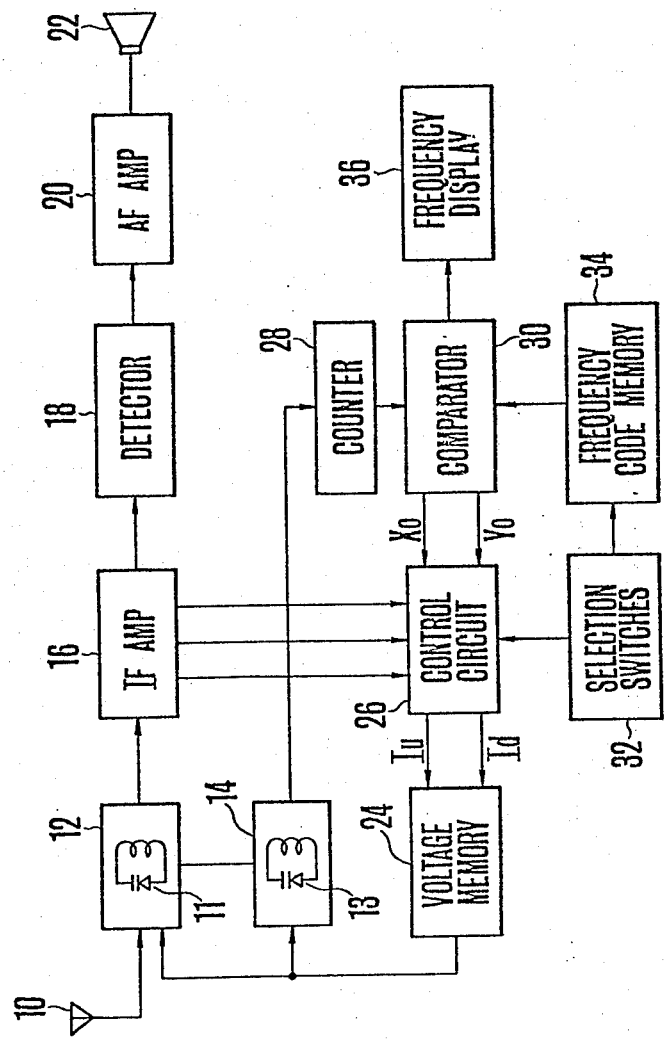
FIG. 1 is a block diagram showing the constitution of an electronic tuning radio receiver.
Figure 2:
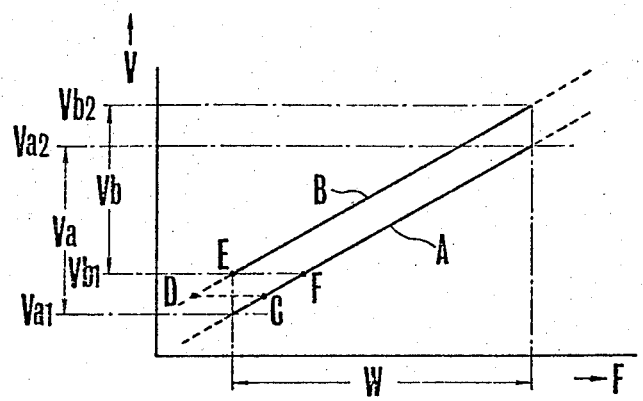
FIG. 2 is a characteristic chart for the explanation of problems resulted upon band switching.

FIG. 4 shows a circuit for upwarding the frequency from the point D to the point E in FIG. 2, by the use of the signal $F_{04}$ representing that the receiving frequency is below the lower limit. FIG. 4 corresponds to the control circuit 26 in FIG. 1 and the details for the structure and the operation of this circuit have been described in Japanese Patent Application No. 70270/1977 filed by the applicant. Referring to the outline thereof, 46 is a digital multiplexer which executes the switching among the search channel selection system, the digital channel selection system and the manual channel selection system. $S_1$ is a manual channel selection switch which executes downward (frequency decreasing) channel selection upon fallen down on the side "d" and upward channel selection upon fallen down on the side "u". $S_2$, $S_3$ are search channel selection switches, the former for downward channel selection and the later for upward channel selection. $S_4$, $S_5$, $S_6$ are switches interlocking with $S_2$, $S_3$, $S_1$ and $S_7$ is a digital channel selection switch. IF is an intermediate frequency output signal, Au and Ad are output signals from an AFC (automatic frequency control) circuit, the former instructing upward and the later instructing the downward selection respectively. EM is a signal normally at "H" level here, Xo, Yo are signals for instructing upward and downward upon digital channel selection outputted from the comparator 30 shown in FIG. 3. 72, 74, 76 and 78 are diodes.

Figure 8:
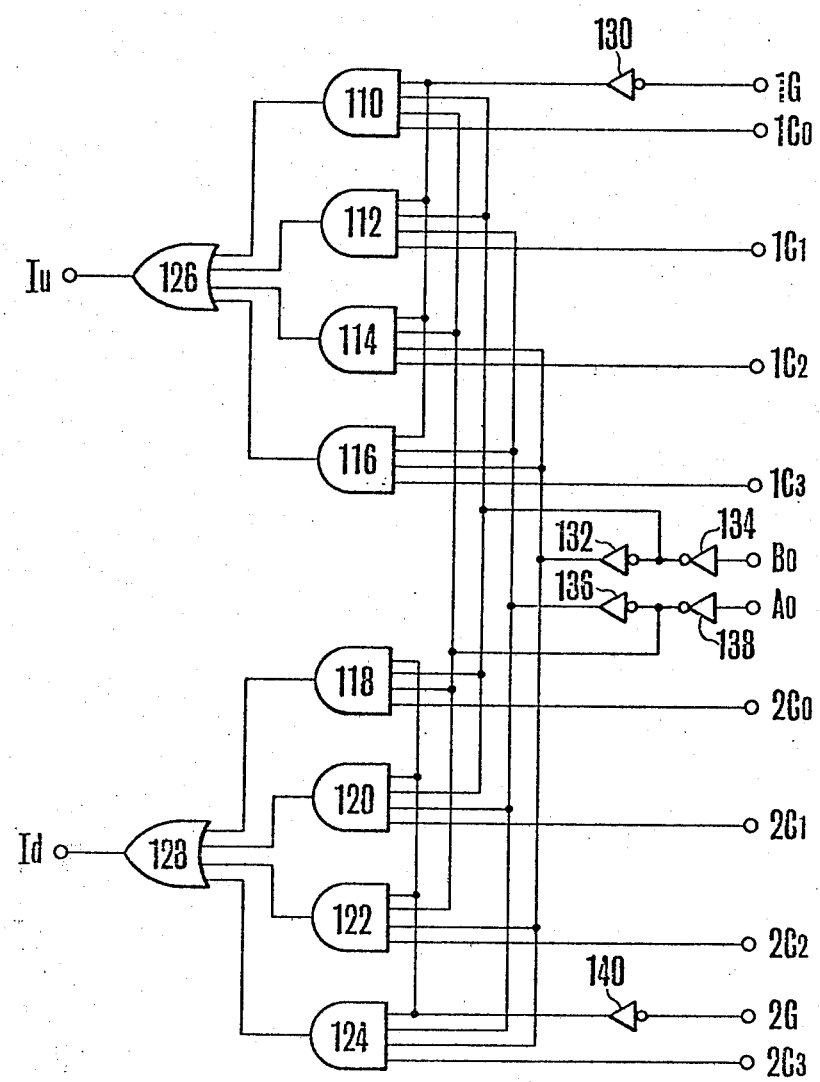
FIG. 8 is a block diagram showing the structure of a digital multiplexer.

FIG. 8 shows one example of a circuit for the digital multiplexer 46. In the figure, 110, 112, 114, 116, 118, 120, 122 and 124 are AND gates, 126 and 128 are OR gates, and 130, 132, 134, 136, 138 and 140 are inverters. The system switching in the multiplexer 46 is executed by the outputs signals Ao, Bo from OR gates 48 and 50. Signals Ao, Bo are also binary signals of 1 and 0, accordingly, designation for 4 modes is possible by these 2 bits, which is to be described referring to FIG. 4 and FIG. 8. Upon closing the switch $S_1$ on the side "d" or "u", the interlocking switch $S_6$ is closed and both of the output signals Ao, Bo from the OR gates 48, 50 take "H" level inverted by the inverter 52. Consequently, outputs from the inverters 134, 138 turn to "L" level to close the AND gates 110, 112, 114, 118, 120 and 122. The outputs from the inverters 132 and 136 turn to "H" level to open the AND gates 116, 124. This switches the multiplexer 46 into the manual channel selection mode, in which the manual channel selection instruction voltage MS inputted by way of the switch $S_1$ (the voltage applied on the side "u" of the switch $S_1$ is referred to as a signal $1C_3$ and the voltage applied on the side "d" is referred to as a signal $2C_3$) is outputted as an upward channel selection instruction signal Iu or a downward channel selection instruction signal Id to the voltage memory. Upon closing the search channel selection switch $S_2$ or $S_3$, the switch $S_4$ or $S_5$ is closed to set flip-flops 56, 58 turning the Q output into "H" level and the $\bar{Q}$ output into "L" level. Accordingly, the output signal Ao from the OR gate 50 turns to "H" level and the outputs signal Bo from the OR gate 48 turns to "L" level, thereby switching the multiplexer 46 into the search channel selection mode. More specifically, the outputs from the inverters 138, 132 turn to "L" level and the outputs from the inverters 134, 136 turn to "H" level to close the AND gates 110, 114, 116, 118, 122 and 124 open the AND gates 112, 120, and thereby outputting the Q output $2C_1$ from the flip-flop 54 as the signal Id or the Q output $1C_1$ as the signal Iu. Then, upon closing the digital channel selection switch $S_7$, the flip-flop 56, 58 are reset to turn the signal Ao to "L" level and the signal Bo to "H" level, which switches the multiplexer into the digital channel selection mode. More specifically, outputs from the inverters 134, 136 turn to "L" level and the outputs from the inverters 138, 132 turn to "L" level to clost the AND gates 110, 112, 116, 118, 120 and 124, and open the AND gates 114, 122 to output the signals Xo, Yo as the signals Iu, Id. Further, when none of the switches is pushed or when the channel selection has been completed, both of the signals Ao, Bo take "L" level, which switches the multiplexer into an AFC mode. More specifically, the outputs from the inverters 134, 138 take "H" level and the outputs from the inverters 132, 136 take "L" level to close the AND gates 112, 114, 116, 120, 122, 124 and open the AND gates 110, 118 to output the AFC signals Au, Ad as the signals Iu, Id.

By the way, if the band is switched in the digital channel selection and the receiving frequency exceeds the lower limit of the new band, the signal $F_{04}$ takes "H" level. The signal is caused to AND action together with a signal $D_{01}$ in an AND gate 60 (for the prevention of error operation) and, thereafter, inputted to the OR gates 48, 50. Consequently, both of the signals Ao, Bo turn to "H" level to switch the multiplexer 46 into the manual channel selection mode. The output signal from the AND gate 60 is also inputted to an OR gate 62, whose output is the same as that issued upon closure of the manual channel selection switch $S_1$ on the side "u" as apparent from the figure. Accordingly, the control is executed for the upwarding direction, that is, frequency increasing direction to pull up the frequency within the band. Since the signal $F_{04}$ is eliminated when the receiving frequency enters within the band, the above control is interrupted and the mode is transferred to the digital channel selection previously manipulated.

The problem that the receiving frequency shifts out of the band by the switching can be caused not only for the lower limit but also for the upper limit but since the upper limit generally has a sufficient margin, reversion to the minimum value upon excess of the maximum value does not occur actually. Accordingly, it is generally sufficient to take the countermeasure only for the lower limit. The table below shows one example for the counting state in the counter 28.

TABLE 1

| Out-of band (downward) | $b_9$ | | | | | | | | |
|---|---|---|---|---|---|---|---|---|---|
| | ↓ | | | | | | | | |
| | ↓ | | | | | | | | |
| | 1 | 0 | 1 | 0 | 1 | 0 | 0 | 1 | 0 |
| | : | : | : | : | : | : | : | : | : |
| | 1 | 1 | 1 | 1 | 1 | 1 | 1 | 1 | 1 |

TABLE 1-continued

Within band
$$\begin{bmatrix} 0 & 0 & 0 & 0 & 0 & 0 & 0 & 0 & 0 \\ 0 & 0 & 0 & 0 & 0 & 0 & 0 & 0 & 1 \\ 0 & 0 & 0 & 0 & 0 & 0 & 0 & 1 & 0 \\ & & & \cdot & & & & & \\ & & & \cdot & & & & & \\ & & & \cdot & & & & & \\ 0 & 1 & 1 & 1 & 0 & 0 & 0 & 0 & 0 \end{bmatrix}$$

Out-f band (upward)
$$\begin{bmatrix} 0 & 1 & 1 & 1 & 0 & 0 & 0 & 0 & 1 \\ 0 & 1 & 1 & 1 & 0 & 0 & 0 & 1 & 0 \\ & & & \cdot & & & & & \\ & & & \cdot & & & & & \\ & & & \cdot & & & & & \end{bmatrix}$$

By the use of the lower limit detection bit $b_9$, manipulations such as automatic interruption for the manual channel selection at the lower limit thereof can be conducted with ease. Since this radio receiver is intended for use in cars, it is desired to enable the channel selection with ease in a state while a driver driving a car. But it is difficult to judge if the upper or the lower limit of the band is exceeded or not without monitoring the dial in the electronic tuning radio receiver and, on the other hand, the channel selection conducted while observing the dial is difficult and dangerous as well in view of driving since it is executed during running. The direction is automatically inverted at the upper or the lower end of the band in the search channel selection, and automatic interruption and, if necessary, issue of alarm are desirably added in the manual channel selection.

Figure 5:
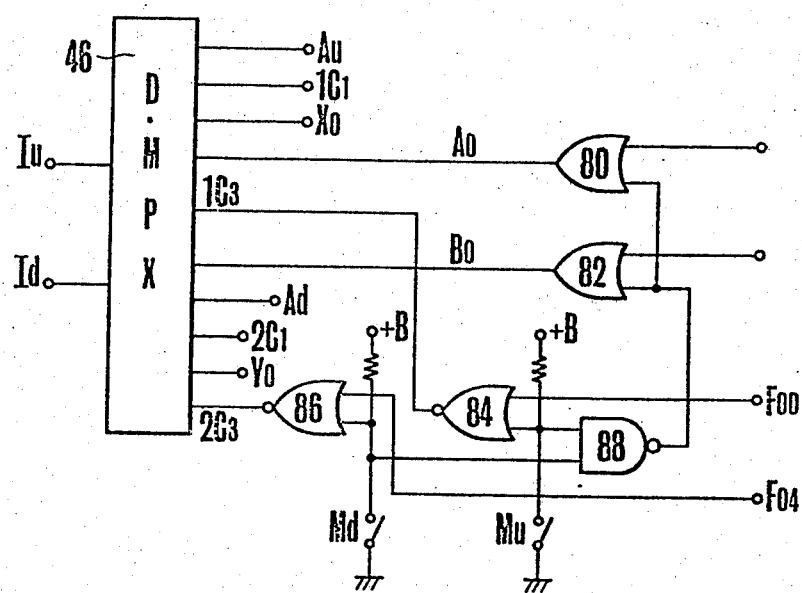
FIG. 5 is a block diagram showing an application embodiment of this invention.

FIG. 5 shows a circuit for interrupting the manual channel selection at the lower end of the band. In the figure, are shown the digital multiplexer 46 described above OR gates 80, 82 for preparing signals Ao, Bo, upward and downward manual channel selection switches Md, Mu corresponding to $S_1$ shown in FIG. 4, the upward and downward search channel selection signals $1C_1$, $2C_1$ described above, the AFC signals Au, Ad for the same directions, and digital channel selection signals Xo, Yo for the same directions. Upon closing the switch Md in this circuit, the output from a NAND gate 88 turns to "H" level and both of the outputs Ao, Bo from the OR gates 80, 82 turn to "H" level to switch the multiplexer 46 into the manual channel selectiom mode. Since the signal $F_{04}$ is at "L" level within the band, the output $2C_3$ from the NOR gate 86 turns to "H" level to start the downward manual channel selection. If the lower limit is exceeded, the signal $F_{04}$ turns to "H" level and, therefor, the output from the NOR gate 86 turns to "L" level to interrupt the downward manual channel selection. Similarly upon closing the switch Mu, the output from the NAND gate 88 turns to "H" and the signals Ao, Bo turn to "H", and the output from the NOR gate 84 turns to "H" within the band since $F_{00}$ prepared by inverting, for example, the signal $F_{04}$ is now at "L" to start the upward manual channel selection. If the upper limit of the band is exceeded, the signal $F_{00}$ turns to "H" level to turn the output from the NOR gate 84 to "L" to interrupt the upward manual channel selection.

Figure 6:
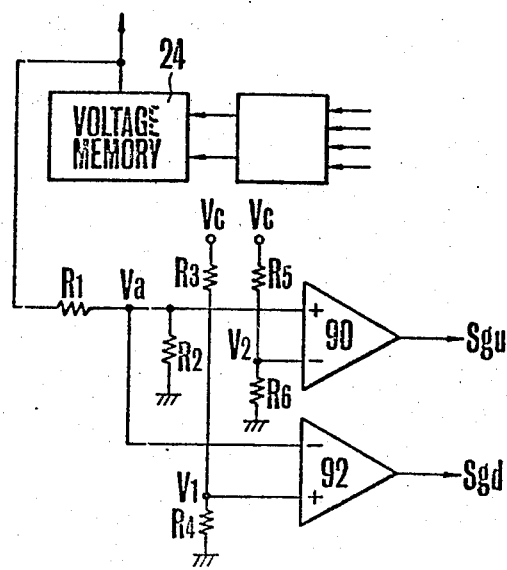
FIG. 6 and FIG. 7 are outlined circuit diagrams showing another example of the out of-band detection circuit.

The upper limit and the lower limit of the band can be detected also by other means. FIG. 6 shows an upper limit and lower limit detection circuit utilizing the output voltage from the voltage memory 24. Since the output voltage from the voltage memory corresponds to the capacitance of the voltage-variable capacitance diode, that is, to the receiving frequency, it is divided by resisters $R_1$ and $R_2$ into a voltage Va of an appropriate level, while on the other hand, a constant voltage $V_c$ is divided by resisters $R_3$ and $R_4$, and $R_5$ and $R_6$ to prepare a lower limit setting voltage $V_1$ and a upper limit setting voltage $V_2$ and these voltages Va and $V_1$, $V_2$ are compared by voltage comparators 90, 92. As the results, when the voltage Va goes higher than $V_2$, the comparator 90 outputs an upper limit detection signal Sgu and when voltage Va goes lower than $V_1$, the comparator 92 outputs a lower limit detection signal Sgd.

Figure 7:
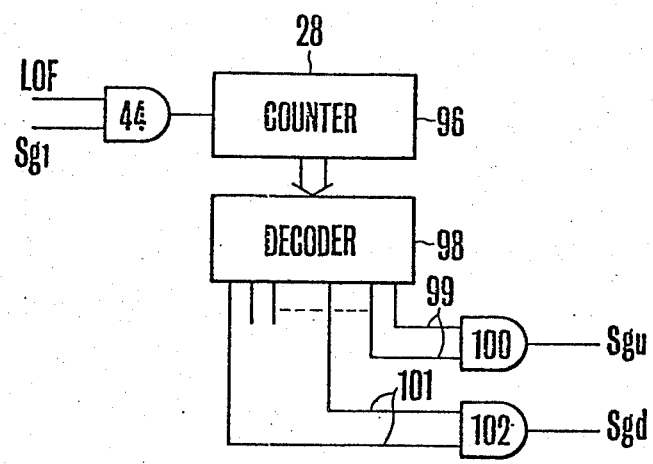

FIG. 7 shows a circuit for the detection of the upper and the lower limits by counting the local oscillation frequency. 96 is the counter described above for counting the local oscillation frequency LOF sampled in the gate 44, and 98 is a decoder for decoding the contents of the above counter. By the connection of output leads 99, 101 from the decoder 98, which takes "H" level at the portion exceeding the lower limit and the upper limit, to the input terminals of AND gates 100, 102, the outputs from the above gates turn to "H" level if the upper or the lower limit is exceeded, by which the upper or the lower limit detection signal Sgu, Sgd can be obtained.

Figure 9:
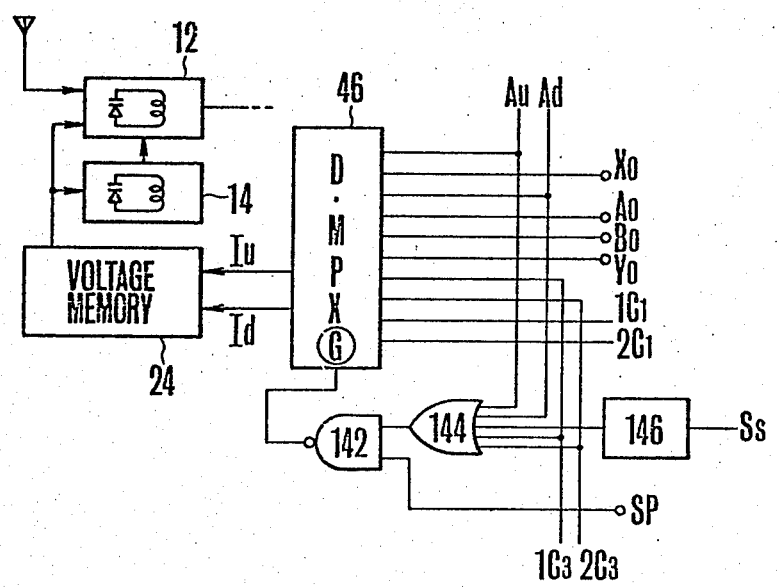
FIG. 9 is a block diagram showing another embodiment of this invention.

As stated above, hunting may be caused or channel selection is disabled if the varying speed in the control voltage is excessively high either in the digital channel selection or in the search channel selection. In order to avoid this, it is desired to convert the upward signal Iu or the downward signal Id applied to the voltage memory 24 into the form of pulses and change the duty ratio thereof. In the circuit proposed previously, a pulse generator has been employed as the power source MS for the manual channel selection instruction (FIG. 4) and the duty in its output pulse is selected to an appropriate value in order to set the sweeping speed to an appropriate value in the manual channel selection. In addition, a gate circuit (not shown) is inserted in the circuit for the signal Xo, Yo and the duty is changed by chopping the signals by the circuit in order to set the sweeping speed to an appropriate value in the digital channel selection. Further, a gate circuit is inserted in the search channel selection system to suppress the sweeping speed at the start of the circuit, but this method complicates the circuit. Change of the duty can be attained with an extreme ease by utilizing the strobe terminals of the digital multiplexer. As shown in FIG. 8, terminals for receiving strobe signals 1G, 2G are provided in the digital multiplexer and, when "H" level signals are inputted to these terminals, they are inverted in inverters 130, 140 to "L" level to close all of the AND gates 110, 112, . . . 124. Then, if pulses of a desired duty is inputted to the strobe terminals, the upward and the downward signals Iu, Id can be converted into pulses with such a duty. FIG. 9 shows on embodiment thereof. The same portions as in FIG. 1 or the like carry the same references also in this figure, as has been done so throughout the foregoing figures. 142 is a NAND gate, 144 is an OR gate and 146 is a differentiation circuit. The manual channel selection signals $1C_3$, $2C_3$, the beginning portion in the search channel selection signals Ss obtained from the differentiation circuit 146 and the AFC signals Au, Ad are inputted to the OR gate 144 and the output therefrom is applied to one of the input terminals of the NAND gate 142. The other of the input of the NAND gate is applied with a switching pulse SP of a predetermined duty. Accordingly, the switching pulse SP is inputted to the multiplexer 46 during the manual channel selection, at the beginning of the search channel selection and during the AFC operation, whereby the gates 110, 112, . . . 124 are turned ON and OFF by the switching pulse SP and, accordingly, the upward and the downward signals Iu, Id are turned ON and OFF. Since insertion of the switching means to each of the channel selection systems is no more necessary according to this circuit, the circuit can be much simplified. Moreover, since the signals Iu, Id are chopped also in the AFC control, fine frequency control is conducted at an appropriate speed to enable AFC control with no hunting. The search channel selection signal Ss is obtainable, for example, by the logic OR for the signals $1C_1$, $2C_1$. The differentiation circuit 146 may alternatively be composed of a monostable multivibrator which is triggered at the beginning edge of the signal Ss and produces a pulse of a predetermined width.

Figure 10:
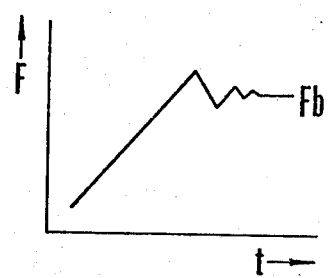
FIG. 10 and FIG. 11 are graphs showing changes in frequency upon channel selection.
Figure 11:
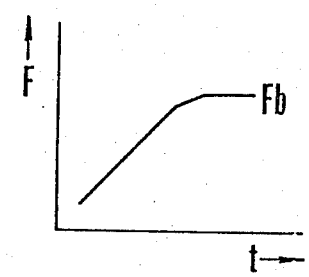

FIG. 10 and FIG. 11 are charts for explanating the foregoing features, in which time t is indicated on the abscissa and the control voltage and the receiving frequency F is indicated on the ordinate. FIG. 10 shows the case proposed previously where the duty is 100% and FIG. 11 shows the case of this invention where the duty is selected to an appropriate value, and convergence to a broadcasting frequency Fb can be attained upon switching with no hunting according to this invention.

While the change in the duty is not made during the digital channel selection in FIG. 9, it can be made by inputting a signal generated when the frequency difference between the local oscillation frequency and the set frequency goes below a predetermined value to the OR gate 144.

Figure 12:
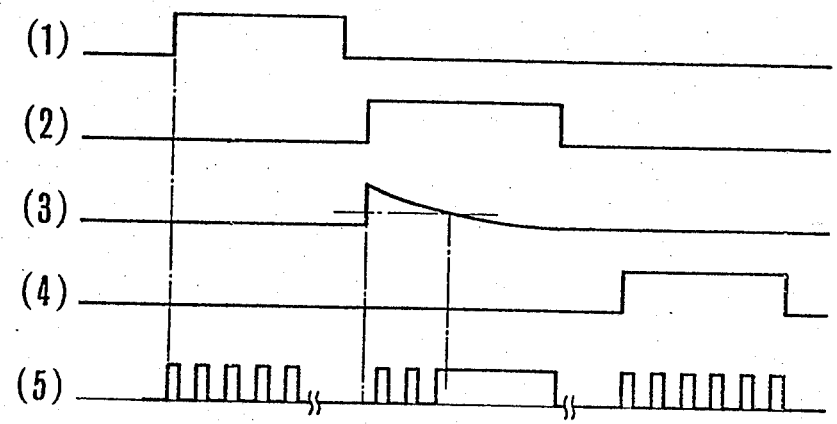
FIG. 12 is a waveform chart for the explanation of the operation.

FIG. 12 is a waveform chart for explanating input and output states for each of the cases, wherein (1) represents the AFC signal Au, (2) represents the search channel selection signal Ss, (3) represents the differentiated signal thereof, (4) represents the manual channel selection signal Mu, and (5) shows the waveform of the upward input signal Iu for each of the cases.

This invention is no way limited only to the examples illustrated and described above but can be modified into various forms within the scope of the claim.

I claim:

1. An electronic tuning radio receiver comprising a voltage variable reactance element tuning circuit including a local oscillator, a voltage memory for supplying a control voltage to said element, and a control circuit including a digital multiplexor, said control circuit providing an upward or a downward signal to said voltage memory in accordance with respective signals initiated by plural types of channel selection switches, a comparator for comparing the counted value of a counter counting the output frequency from said local oscillator and a frequency code selected by a digital channel selection switch to provide a comparison output signal to said control circuit, thereby causing said voltage memory to output a gradually increasing or decreasing control voltage, said receiver further comprising means for detecting that upon switching from a first frequency band to a second frequency band a frequency for reception during operation in the first band shifts to a frequency outside the second band and a circuit coupled to said control circuit for varying said control voltage to a value corresponding to a reception frequency within said second band in response to an output from said detection means.

2. The electronic tuning radio receiver as described in claim 1, in which the detection means comprises an additional 1 bit position element further furnished as the most significant bit of the bit group in the counter for counting the local oscillation frequency.

3. The electronic tuning radio receiver as described in claim 1, in which the detection means comprises a comparator for comparing the control voltage from said voltage with a reference value.

4. The electronic tuning radio receiver as described in claim 1, in which the detection means comprises a decoder for decoding the counted value from the counter and a gate circuit generating an output when the output from said decoder is below a predetermined value.

5. The electronic tuning radio receiver as described in any one of claims 1-4, in which the circuit for changing the control voltage to a value corresponding to a reception frequency within said second band comprises a gate circuit which switches the control circuit into a manual channel selection mode upon input of a detection signal indicating the reception frequency being outside the second band and inputs a signal equivalent to an upward manual channel selection instruction to said control circuit.

6. The electronic tuning radio receiver as described in claim 5, in which a pulse generator circuit for converting the upward or downward signal outputted from the control circuit into pulses and setting the duty ratio thereof to a desired value is connected to the strobe terminals of the digital multiplexer.

7. The electronic tuning radio receiver as described in claim 6, in which the pulse generator circuit comprises an OR gate supplied with an AFC signal, a manual channel selection signal and the beginning portion of a search channel selection signal, and an AND gate supplied with the output from said OR gate and switching pulses.

* * * * *

UNITED STATES PATENT AND TRADEMARK OFFICE
CERTIFICATE OF CORRECTION

PATENT NO. : 4,313,214
DATED : January 26, 1982
INVENTOR(S) : Tatsuo Ito

It is certified that error appears in the above—identified patent and that said Letters Patent is hereby corrected as shown below:

Column 6, line 4, delete "Q" and substitute --$\overline{Q}$--.

line 14, delete "Q" and substitute --$\overline{Q}$--.

Column 8, line 58, delete "on" and substitute --one--.

Column 10, line 25, after "voltage" insert --memory--.

line 45, delete "the".

Signed and Sealed this

Twenty-ninth Day of June 1982

[SEAL]

Attest:

GERALD J. MOSSINGHOFF

*Attesting Officer*　　　*Commissioner of Patents and Trademarks*